US012167650B2

(12) United States Patent
Lee et al.

(10) Patent No.: US 12,167,650 B2
(45) Date of Patent: Dec. 10, 2024

(54) FLEXIBLE DEVICE AND ELECTRONIC DEVICE

(71) Applicant: Samsung Electronics Co., Ltd., Suwon-si (KR)

(72) Inventors: Gae Hwang Lee, Seongnam-si (KR); Youngjun Yun, Seongnam-si (KR); Jong Won Chung, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 501 days.

(21) Appl. No.: 17/530,908

(22) Filed: Nov. 19, 2021

(65) Prior Publication Data
US 2023/0019482 A1  Jan. 19, 2023

(30) Foreign Application Priority Data

Jul. 14, 2021 (KR) ........................ 10-2021-0092252

(51) Int. Cl.
| *H01L 27/32* | (2006.01) |
| *H10K 39/32* | (2023.01) |
| *H10K 59/121* | (2023.01) |
| *H10K 59/131* | (2023.01) |
| *H10K 77/10* | (2023.01) |
| *H10K 102/00* | (2023.01) |

(52) U.S. Cl.
CPC .......... *H10K 59/131* (2023.02); *H10K 39/32* (2023.02); *H10K 59/1213* (2023.02); *H10K 77/111* (2023.02); *H10K 2102/311* (2023.02)

(58) Field of Classification Search
CPC .. H10K 59/131; H10K 39/32; H10K 59/1213; H10K 10/00; H10K 30/00; H10K 50/00; H10K 71/60; H10K 77/111; H10K 2102/311; Y02E 10/549; H01L 27/1218; H01L 27/1222; H01L 27/124; H01L 27/1251; H10N 30/098
See application file for complete search history.

(56) References Cited

U.S. PATENT DOCUMENTS 8,207,473 B2   6/2012  Axisa et al.
9,401,487 B2   7/2016  Im et al.
(Continued)

FOREIGN PATENT DOCUMENTS

CN    109616492 B    11/2020
CN    109920334 B     4/2021
(Continued)

OTHER PUBLICATIONS

Extended European Search Report dated May 9, 2022 for corresponding European Application No. 21209019.5.

*Primary Examiner* — Jarrett J Stark
(74) *Attorney, Agent, or Firm* — Harness, Dickey & Pierce, P.L.C.

(57) ABSTRACT

A flexible device includes a substrate including a first region having a first elastic modulus and a second region having a second elastic modulus that is lower than the first elastic modulus, a pixel circuit on the substrate, and a unit device electrically connected to the pixel circuit, wherein the pixel circuit includes a plurality of thin film transistors, a first portion of the plurality of thin film transistors is on the first region of the substrate, and a second portion of the plurality of thin film transistors is on the second region of the substrate.

34 Claims, 11 Drawing Sheets

(56) References Cited

U.S. PATENT DOCUMENTS

| | | |
|---|---|---|
| 9,478,727 B2 | 10/2016 | Bose et al. |
| 9,799,708 B2 | 10/2017 | Hong et al. |
| 9,945,739 B2 | 4/2018 | Jeon et al. |
| 10,003,126 B2 | 6/2018 | Sotzing |
| 10,417,948 B2 | 9/2019 | Choi |
| 10,910,595 B2 | 2/2021 | Wang et al. |
| 11,056,472 B2 | 7/2021 | Kim et al. |
| 11,145,833 B2* | 10/2021 | Kim, II ................ H10K 59/873 |
| 2013/0316487 A1* | 11/2013 | de Graff .................. A61B 1/04 |
| | | 438/66 |
| 2016/0211482 A1* | 7/2016 | Namkung ............... H10K 50/84 |
| 2016/0233453 A1* | 8/2016 | Lee ........................ G06F 1/3206 |
| 2016/0269720 A1* | 9/2016 | Patel .................... H04N 13/344 |
| 2016/0336537 A1* | 11/2016 | Tsuruoka ............ H01L 27/1218 |
| 2017/0224257 A1 | 8/2017 | Rogers |
| 2017/0331045 A1 | 11/2017 | Chung et al. |
| 2019/0181154 A1 | 6/2019 | Xia |
| 2020/0111390 A1 | 4/2020 | Kim et al. |
| 2020/0119294 A1* | 4/2020 | Kim, II ................ H10K 59/131 |
| 2020/0203608 A1* | 6/2020 | Jang ..................... H10K 50/115 |
| 2021/0036229 A1 | 2/2021 | Lee et al. |
| 2021/0126082 A1* | 4/2021 | Yoon .................... H10K 59/123 |
| 2021/0210523 A1 | 7/2021 | Sui et al. |
| 2021/0313527 A1 | 10/2021 | Hong et al. |
| 2021/0335951 A1 | 10/2021 | Wang et al. |
| 2022/0068177 A1 | 3/2022 | Liu et al. |
| 2023/0019482 A1* | 1/2023 | Lee ...................... H10K 59/131 |

FOREIGN PATENT DOCUMENTS

| | | |
|---|---|---|
| KR | 2008-0073944 A | 8/2008 |
| KR | 2009-0072494 A | 7/2009 |
| KR | 102030235 B1 | 10/2019 |
| KR | 2020-0062603 A | 6/2020 |
| KR | 2021-0014566 A | 2/2021 |
| KR | 102236481 B1 | 4/2021 |
| KR | 2021-0048945 A | 5/2021 |
| WO | WO-2020/093354 A1 | 5/2020 |
| WO | WO-2021/078089 A1 | 4/2021 |

* cited by examiner

FLEXIBLE DEVICE AND ELECTRONIC DEVICE

CROSS-REFERENCE TO RELATED APPLICATION

This application claims priority to and the benefit of Korean Patent Application No. 10-2021-0092252 filed in the Korean Intellectual Property Office on Jul. 14, 2021, the entire contents of which are incorporated herein by reference.

BACKGROUND

1. Field

Flexible devices and electronic devices are disclosed.

2. Description of the Related Art

Recently, research on flexible devices such as flexible display panels and wearable sensors has been conducted. Such flexible devices may require flexibility to be bent, curved, or folded in a particular (or, alternatively, predetermined) direction, and may additionally require stretchability that can be stretched and contracted according to the shape of an object or the movement of a living body.

SUMMARY

In order to implement a high-performance device such as a high-resolution display panel or a high-sensitivity sensor array, it is desired to increase the number of pixels per unit area by reducing a size of a pixel. However, since it is desired and/or needed that the flexible device secures a particular (or, alternatively, predetermined) region for providing flexibility or stretchability to the substrate, an area occupied by the pixels may be reduced, thereby limiting an increase in the number (e.g., quantity) of pixels per unit area.

Some example embodiments provide a flexible device capable of implementing improved performance while securing flexibility or stretchability.

Some example embodiments provide an electronic device including the flexible device.

According to some example embodiments, a flexible device may include a substrate including a first region and a second region, the first region having a first elastic modulus and the second region having a second elastic modulus that is lower than the first elastic modulus. The flexible device may include a plurality of pixel circuits spaced apart on the substrate and a plurality of unit devices that are each electrically connected to a separate pixel circuit of the plurality of pixel circuits. Each pixel circuit of the plurality of pixel circuits includes a plurality of thin film transistors. A first portion of the plurality of thin film transistors may be on the first region of the substrate. A second portion of the plurality of thin film transistors may be on the second region of the substrate.

The plurality of thin film transistors may include a first thin film transistor and a second thin film transistor. The first thin film transistor may be on the first region of the substrate. The second thin film transistor may be on the second region of the substrate.

The first thin film transistor may include a non-stretchable semiconductor layer, and the second thin film transistor may include a stretchable semiconductor layer.

The stretchable semiconductor layer may include a semiconductor material and an elastomer.

The semiconductor material may include an organic semiconductor, an oxide semiconductor, or any combination thereof.

The stretchable semiconductor layer may include an organic semiconductor.

The first thin film transistor may be a driving thin film transistor, and the second thin film transistor may be a switching thin film transistor.

The first region of the substrate may be a plurality of island-shaped regions spaced apart at a particular interval, and the second region of the substrate may be a stretchable region of the substrate and may be a single, continuous structure that extends continuously between the plurality of island-shaped regions.

The flexible device may further include a connecting wire on the stretchable region of the substrate, the connecting wire electrically connecting adjacent unit devices of the plurality of unit devices.

The first region of the substrate may include a plurality of island-shaped regions spaced apart at a particular interval, and a connection region connecting the plurality of island-shaped regions.

The flexible device may further include a connecting wire on the connection region of the substrate, the connecting wire electrically connecting adjacent unit devices of the plurality of unit devices that at least partially overlap separate, respective adjacent island-shaped regions.

The second region of the substrate may include a plurality of incision lines configured to be deformable by an external force.

The first elastic modulus may be about 10 times to about $10^8$ times higher than the second elastic modulus.

The first region r of the substrate may include polycarbonate, polymethylmethacrylate, polyethyleneterephthalate, polyethylenenaphthalate, polyimide, polyamide, polyamide-imide, polyethersulfone, or any combination thereof, and the second region of the substrate may include a polyorganosiloxane, a polymer comprising a butadiene moiety, a polymer comprising a urethane moiety, a polymer comprising an acrylic moiety, a polymer comprising an olefin moiety, or any combination thereof.

The first region of the substrate may include a first polymer, and the second region of the substrate may include a second polymer, wherein the first polymer and the second polymer comprise at least one same structural unit.

The first polymer may be a first copolymer that includes a hard structural unit of the first polymer and a soft structural unit of the first polymer, the second polymer is a second copolymer that includes a hard structural unit of the second polymer and a soft structural unit of the second polymer, a weight ratio of the hard structural unit of the first polymer to the soft structural unit of the first polymer may be about 1.2 to about 9.9, and a weight ratio of the hard structural unit of the second polymer to the soft structural unit of the second polymer may be about 0.01 to about 0.7.

Each unit device of the plurality of unit devices may include a light emitting diode, photoelectric conversion diode, or any combination thereof.

Each unit device of the plurality of unit devices may be on the first region of the substrate.

Each pixel circuit of the plurality of pixel circuits may further include a capacitor, the plurality of thin film transistors may include a driving thin film transistor and a switching thin film transistor, the capacitor of each pixel circuit, the driving thin film transistor of each pixel circuit, and the plurality of unit devices may be on the first region of the substrate, and the switching thin film transistor of each pixel circuit may be on the second region of the substrate.

The flexible device may be a display panel or sensor array, and a quantity of pixels per unit area of the display panel or the sensor array may be about 200 ppi to about 1000 ppi.

The substrate may be a stretchable substrate.

According to some example embodiments, a flexible device may include a substrate including a first region having a first elastic modulus and a second region having a second elastic modulus that is lower than the first elastic modulus, a plurality of pixel circuits spaced apart on the substrate, and a plurality of unit devices on the first region of the substrate, the plurality of unit devices each being electrically connected to a separate pixel circuit of the plurality of pixel circuits. Each pixel circuit of the plurality of pixel circuits may include a driving thin film transistor and a switching thin film transistor. The switching thin film transistor may be on the second region of the substrate.

The plurality of unit devices and the driving thin film transistor may be both on the first region of the substrate.

The switching thin film transistor and the driving thin film transistor may include a same semiconductor layer or different semiconductor layers, the switching thin film transistor may include an organic semiconductor layer, a first oxide semiconductor layer, or any combination thereof, and the driving thin film transistor may include a silicon semiconductor layer, a second oxide semiconductor layer, or any combination thereof.

The flexible device may be a display panel or a sensor array, and a quantity of pixels per unit area of the display panel or the sensor array may be about 200 ppi to about 1000 ppi.

An electronic device may include the flexible device.

According to some example embodiments, a flexible device may include a substrate including a first region and a second region, the first region having a first elastic modulus and the second region having a second elastic modulus that is lower than the first elastic modulus, a pixel circuit on the substrate, the pixel circuit including a plurality of thin film transistors, at least one thin film transistor of the plurality of thin film transistors being on the second region of the substrate, and a unit device on the first region of the substrate, the unit device electrically connected to the pixel circuit.

The plurality of thin film transistors may include a driving thin film transistor and a switching thin film transistor, the at least one thin film transistor that is on the second region of the substrate may include the switching thin film transistor, and the driving thin film transistor is on the first region of the substrate.

The switching thin film transistor may include an organic semiconductor layer, a first oxide semiconductor layer, or any combination thereof, and the driving thin film transistor may include a silicon semiconductor layer, a second oxide semiconductor layer, or any combination thereof.

The first region of the substrate may be a plurality of island-shaped regions spaced apart at a particular interval, the second region of the substrate may be a stretchable region of the substrate and may be a single, continuous structure that extends continuously between the plurality of island-shaped regions, the flexible device may include a plurality of pixel circuits, the plurality of pixel circuits including the pixel circuit, each pixel circuit including a separate plurality of thin film transistors that are partially on a separate island-shaped region of the plurality of island-shaped regions, and the flexible device may further include a plurality of unit devices, the plurality of unit devices including the unit device, each unit device electrically connected to a separate pixel circuit of the plurality of pixel circuits.

The flexible device may further include a connecting wire on the second region of the substrate, the connecting wire electrically connecting adjacent unit devices of the plurality of unit devices that at least partially overlap separate, respective adjacent island-shaped regions.

The first region of the substrate may include a connection region connecting the plurality of island-shaped regions, and the flexible device may further include a connecting wire on the connection region, the connecting wire electrically connecting adjacent unit devices of the plurality of unit devices that at least partially overlap separate, respective adjacent island-shaped regions.

Each pixel circuit of the plurality of pixel circuits may include a capacitor, the plurality of thin film transistors of each pixel circuit of the plurality of pixel circuits may include a driving thin film transistor and a switching thin film transistor, the capacitor of each pixel circuit and the driving thin film transistor of each pixel circuit may be on the first region of the substrate, and the switching thin film transistor of each pixel circuit may be on the second region of the substrate.

The at least one thin film transistor may overlap at least a portion of the second region of the substrate in a direction extending perpendicular to an upper surface of the substrate and may not overlap any portion of the first region in the direction.

An electronic device may include the flexible device.

It is possible to improve the performance of the flexible device while ensuring flexibility or stretchability.

DETAILED DESCRIPTION

Figure 1:
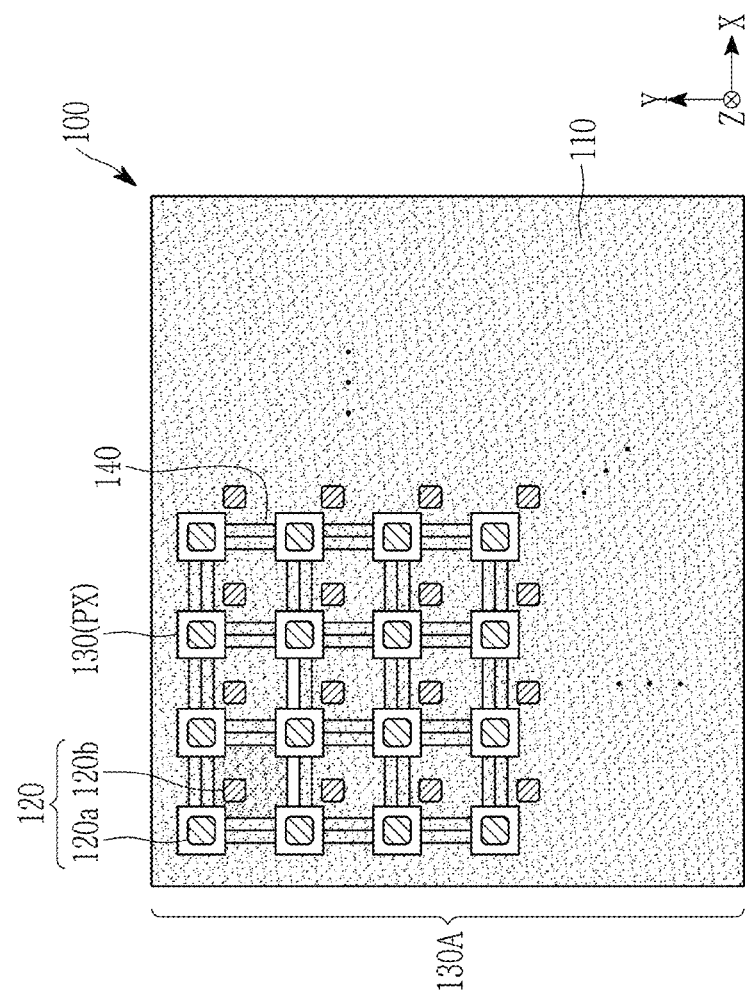
FIG. 1 is a plan view showing an example of a flexible device according to some example embodiments.

Hereinafter, some example embodiments will be described in detail so that those of ordinary skill in the art can easily implement them. However, the structure that is actually applied may be implemented in various different forms, and is not limited to the embodiments described herein.

In the drawings, the thickness of layers, films, panels, regions, etc., are exaggerated for clarity.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Hereinafter, as used herein, when a definition is not otherwise provided, "substituted" refers to replacement of hydrogen of a compound or a functional group by a substituent selected from a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a silyl group, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroaryl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

Hereinafter, "polymer" includes a homopolymer, a copolymer, or any combination thereof.

Hereinafter, "combination" includes a mixture, a composite, or a stacked structure of two or more.

Hereinafter, a device, layer, element, region, or the like that is described as being "stretchable" will be understood to be elastic and/or configured to be elastic, such that the device, layer, element, region, or the like is configured to be elastically deformed (e.g., stretched, compressed, subjected to strain, etc.) such that the device, layer, element, region, or the like is configured to resume its same original shape after being deformed. For example, a stretchable device, layer, element, region, or the like as described herein may be capable of being elastically deformed such that the stretchable device, layer, element, region, or the like can resume, and does resume, an original shape after being stretched or compressed.

Hereinafter, a device, layer, element, region, or the like that is described as being "non-stretchable" will be understood to be non-elastic and/or not configured to be elastic, such that the device, layer, element, region, or the like is configured to not be elastically deformed (e.g., stretched, compressed, subjected to strain, etc.) such that the device, layer, element, region, or the like is configured to not resume its same original shape after being deformed. For example, a non-stretchable device, layer, element, region, or the like as described herein may not be able to be elastically deformed due to applied strain such that the non-stretchable device, layer, element, region, or the like cannot, and does not, resume an original shape after being stretched or compressed.

Hereinafter, a flexible device may be an electronic device formed on a substrate deformable by an external force, and includes a stretchable device that may be stretched and restored by an external force.

Hereinafter, a flexible device according to some example embodiments is described with reference to the drawings.

A flexible device according to some example embodiments may include any electronic device that has flexible and/or stretchable characteristics and operates in an active matrix manner, and may include, for example, a flexible display panel, a stretchable display panel, a flexible sensor array, and a stretchable sensor array, or any combination thereof.

Figure 2:
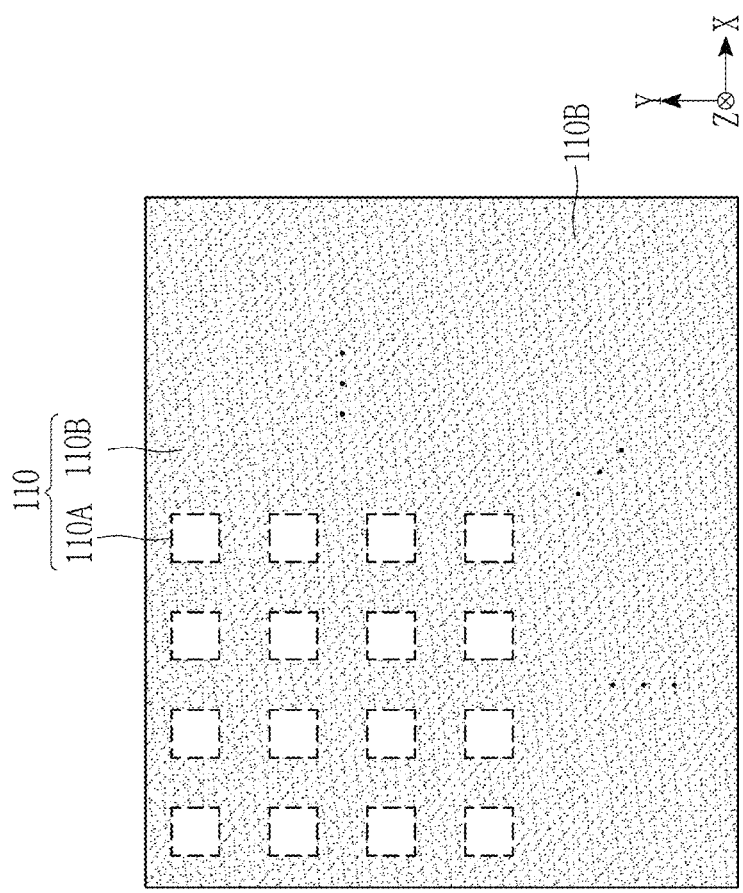
FIG. 2 is a plan view showing an example of a substrate included in the flexible device of FIG. 1 according to some example embodiments.
Figure 3:
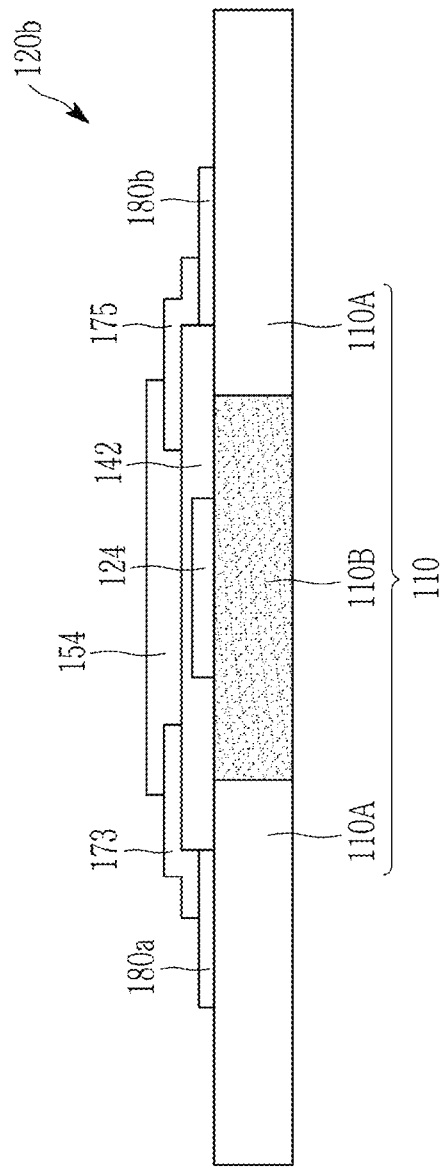
FIG. 3 is a cross-sectional view showing an example of the thin film transistor of the flexible device of FIG. 1 according to some example embodiments.
Figure 4:
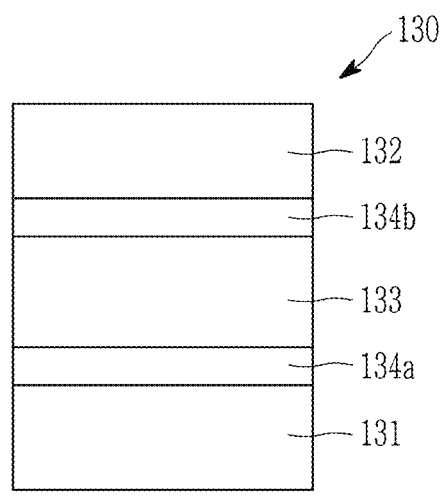
FIG. 4 is a cross-sectional view showing an example of a unit device of the flexible device of FIG. 1 according to some example embodiments.
Figure 5:
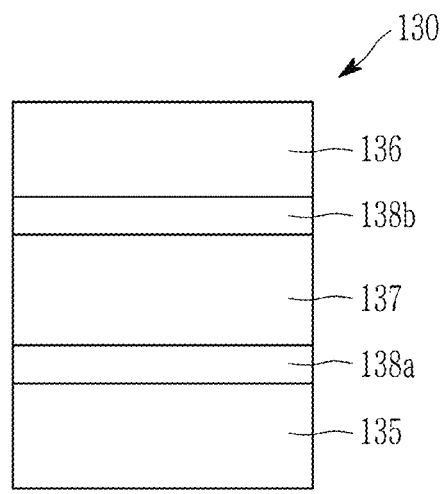
FIG. 5 is a cross-sectional view showing another example of the unit device of the flexible device of FIG. 1 according to some example embodiments.

FIG. 1 is a plan view showing an example of a flexible device according to some example embodiments, FIG. 2 is a plan view showing an example of a substrate included in the flexible device of FIG. 1 according to some example embodiments, FIG. 3 is a cross-sectional view showing an example of the thin film transistor of the flexible device of FIG. 1 according to some example embodiments, FIG. 4 is a cross-sectional view showing an example of a unit device of the flexible device of FIG. 1 according to some example embodiments, and FIG. 5 is a cross-sectional view showing another example of the unit device of the flexible device of FIG. 1 according to some example embodiments.

Referring to FIG. 1, the flexible device 100 includes a substrate 110, a plurality of pixel circuits 120, a unit device 130, and a connecting wire 140.

The flexible device 100 may include a plurality of pixels PX, and the plurality of pixels PX may have a matrix arrangement (e.g., matrix pattern) that is repeatedly arranged along rows and/or columns. Each pixel PX may include a plurality of subpixels, and the plurality of subpixels included in each pixel PX may have an arrangement such as 3×1, 2×2, 3×3, 4×4, but is not limited thereto. The arrangement of the plurality of pixels PX (or subpixels) may be the same as that of the unit device 130, for example, a Bayer matrix, a PenTile matrix, and/or a diamond matrix, and the like, but is not limited thereto. In the following description, the terms "pixel" and "subpixel" may be used interchangeably.

Although all pixels PX are illustrated as having the same size in the drawing, the present inventive concepts are not limited thereto, and one or more pixels PX may be larger or smaller than other pixels PX. Although all pixels PX are illustrated as having the same shape in the drawing, the present inventive concepts are not limited thereto, and one or more pixels PX may have a different shape from other pixels PX.

The substrate 110 may be a flexible substrate that may be bent, curved, or folded in a particular (or, alternatively, predetermined) direction or a stretchable substrate that may be stretched and restored in a particular (or, alternatively, predetermined) direction. The substrate 110 may flexibly respond to external forces or external movements such as twisting, pressing, and pulling in a particular (or, alternatively, predetermined) direction. The substrate 110 may be a light-transmitting substrate.

The substrate 110 may include a flexible and/or stretchable material, the flexible and/or stretchable material including, for example, a polymer (including organic-inorganic polymer), an inorganic elastomer-like material, or any combination thereof. The polymer may be, for example, polycarbonate, polymethylmethacrylate, polyethyleneterephthalate, polyethylenenaphthalate, polyimide, polyamide, polyamideimide, polyethersulfone, a substituted or unsubstituted polyorganosiloxane such as polydimethylsiloxane, a polymer including a substituted or unsubstituted butadiene moiety, such as styrene-ethylene-butylene-styrene, a polymer including a urethane moiety, a polymer including an acrylic moiety, a polymer including an olefin moiety, or any combination thereof, but is not limited thereto. The inorganic elastomer-like material may include a ceramic having elasticity, a solid metal, a liquid metal, or any combination thereof, but is not limited thereto. The substrate 110 may have one layer or two or more layers made of different materials.

The substrate 110 may include a plurality of regions having different stiffness. Herein, the stiffness indicates a degree of resistance against deformation, when an external force is given from outside, and when the stiffness is relatively high, the resistance against deformation is relatively large, and thus the deformation is small, but when the stiffness is relatively low, the resistance against deformation is relatively small, and thus the deformation is large. The stiffness may be evaluated from an elastic modulus, wherein a relatively high elastic modulus may mean relatively high stiffness, while a relatively low elastic modulus may mean relatively low stiffness. The elastic modulus may be, for example, a Young's modulus.

Referring to FIG. 2, the substrate 110 includes a first region 110A having a relatively high elastic modulus (first elastic modulus) and a second region 110B having a relatively low elastic modulus (second elastic modulus); for example the elastic modulus of the second region 110B (e.g., the second elastic modulus) may be lower than the elastic modulus of the first region 110A (e.g., the first elastic modulus). A difference between the elastic modulus of the first region 110A of the substrate 110 and the elastic modulus of the second region 110B of the substrate 110 (e.g., a magnitude and/or proportion by which the first elastic modulus may be greater than the second elastic modulus) may be about 10 times or more, within the above range, about 50 times or more, about 100 times or more, about 500 times or more, or about 1000 times or more, and within the above range, about 10 times to about $10^8$ times, about 50 times to about $10^8$ times, about 100 times to about $10^8$ times, about 500 times to about $10^8$ times, about 1000 times to about $10^8$ times, about 10 times to about $10^7$ times, about 50 times to about $10^7$ times, about 100 times to about $10^7$ times, about 500 times to about $10^7$ times, or about $10^3$ times to about $10^7$ times. For example, the elastic modulus of the first region 110A of the substrate 110 may be about 10 times to about $10^8$ times higher than the elastic modulus of the second region 110B of the substrate 110. For example, the elastic modulus of the first region 110A of the substrate 110 may be about $10^3$ Pa to about $10^{12}$ Pa, and the elastic modulus of the second region 110B of the substrate 110 may be about 100 Pa to about $10^9$ Pa, but are limited thereto.

The first region 110A of the substrate 110 may be a plurality of island-shaped regions arranged at a particular (or, alternatively, predetermined) interval (e.g., spaced apart and thus isolated from direct contact with each other at the particular interval), and each island-shaped region may correspond to each pixel PX and may be overlapped (e.g., overlapped in the Z direction) with a unit device 130 to be described later. Accordingly, the plurality of first regions 110A (island-shaped regions) of the substrate 110 may be repeatedly arranged along rows and/or columns, like the pixels PX.

The second region 110B of the substrate 110 may be a region other than the first region 110A, and may be between the plurality of first regions 110A (island-shaped regions). For example, the second region 110B of the substrate 110 may be continuously connected over the entire substrate 110. For example, the second region 110B of the substrate may be a single, continuous structure (e.g., a unitary piece of material) that extends continuously between adjacent island-shaped regions of the plurality of island-shaped regions of the first regions 110A. The second region 110B of the substrate 110 may be a stretchable region (e.g., a region of the substrate 110 that is elastic and/or is configured to be elastically deformed (e.g., subjected to strain) such that the second region 110B is configured to resume its original shape after being deformed, such as being subjected to strain, stretched, and/or compressed) that provides flexibility and/or stretchability to the substrate 110. Due to its relatively low rigidity, it may flexibly respond to external forces or external movements such as twisting, pressing, and pulling, and may be easily restored to its original state.

For example, the first region 110A and the second region 110B of the substrate 110 may be made of (e.g., may at least partially comprise) different materials. For example, the first region 110A of the substrate 110 may include an inorganic material, an organic material, an organic-inorganic material, or any combination thereof having a relatively high elastic modulus, and the second region 110B of the substrate 110 may include an inorganic material, an organic material, an organic-inorganic material, or any combination thereof having a relatively low elastic modulus. For example, the first region 110A of the substrate 110 may include polycarbonate, polymethyl methacrylate, polyethylene terephthalate, polyethylene naphthalate, polyimide, polyamide, polyamideimide, polyethersulfone, or any combination thereof, and the second region 110B of the substrate 110 may include a polyorganosiloxane, a polymer including a butadiene moiety, a polymer including a urethane moiety, a polymer including an acrylic moiety, a polymer including an olefin moiety, or any combination thereof, but are not limited thereto. The second region 110B of the substrate 110 may include, for example, one selected from polydimethylsiloxane (PDMS), thermoplastic polyurethane (TPU), styrene-ethylene-butylene-styrene (SEBS), styrene-ethylene-propylene-styrene (SEPS), styrene-butadiene-styrene (SBS), styrene-isoprene-styrene (SIS), styrene-isobutylene-styrene (SIBS), and a combination thereof, but is not limited thereto.

For example, the first region 110A and the second region 110B of the substrate 110 may be made based on the same polymer and may have different elastic modulus by varying conditions such as a degree of polymerization and/or a degree of curing. For example, in the substrate 110, based on polydimethylsiloxane (PDMS) by varying the degree of polymerization, the type and content of the curing agent, and/or the curing temperature, the first region 110A having a relatively high elastic modulus and the second region 110B having a relatively low elastic modulus may be formed.

For example, the first region 110A and the second region 110B of the substrate 110 may be made of different polymers and include at least one structural unit in common. For example, the first region 110A of the substrate 110 may include a first polymer and the second region 110B of the substrate 110 may include a second polymer, wherein the first polymer and the second polymer may include at least one structural unit in common. The first polymer and the second polymer may each be, for example, a thermoplastic polymer. For example, the first polymer and the second polymer may include two types of structural units, and may include one or two types of structural units in common. For example, the first polymer and the second polymer may include three types of structural units, and among them, may include one, two, or three types of structural units in common. As such, the first polymer and the second polymer include at least one structural unit in common (e.g., at least one same structural unit), thereby reducing heterogeneity at the interface between the first region 110A and the second region 110B of the substrate 110 and simultaneously increasing adhesiveness of the interface between the first region 110A and the second region 110B of the substrate 110 by forming chemical bonds such as crosslinking bonds between the first and second polymers at temperatures above the glass transition temperature (Tg) or melting temperature (Tm) due to the thermoplastic properties of the first and second polymers.

For example, the first polymer and/or the second polymer may each independently be a copolymer including at least one hard structural unit providing hard properties and optionally at least one soft structural unit providing soft properties. For example, the hard structural unit may be a styrene-containing structural unit, an olefin-containing structural unit, a urethane-containing structural unit, an ether-containing structural unit, or any combination thereof, and the soft structural unit may be an ethylene structural unit, a propylene structural unit, a butylene structural unit, an isobutylene structural unit, a butadiene structural unit, an isoprene structural unit, or any combination thereof. For example, the first polymer may be a first copolymer that includes a hard-structural unit of the first polymer and a soft-structural unit of the first polymer, and the second polymer may be a second copolymer that includes a hard-structural unit of the second polymer and a soft-structural unit of the second polymer. The first polymer and the second polymer may include, for example, the hard structural units in common, for example a styrene-containing structural unit, an olefin-containing structural unit, a urethane-containing structural unit, an ether-containing structural unit, or any combination thereof. Accordingly, the first polymer and the second polymer may belong to any one of a styrene-containing polymer, an olefin-containing polymer, a urethane-containing polymer, or an ether-containing polymer. For example, the first polymer and the second polymer may include a styrene-containing structural unit as a hard structural unit in common, and each of the first polymer and the second polymer may independently include, as a soft structural unit, an ethylene structural unit, a propylene structural unit, a butylene structural unit, an isobutylene structural unit, a butadiene structural unit, an isoprene structural unit, or any combination thereof.

For example, the first polymer and the second polymer may have different elastic moduli by adjusting the ratio of the aforementioned hard structural unit and soft structural unit. For example, a weight ratio of hard structural units relative to soft structural units of the first polymer may be larger than a weight ratio of hard structural units relative to soft structural units of the second polymer, and thus the first polymer will have a higher elastic modulus than the second polymer. For example, the weight ratio of hard structural units relative to soft structural units of the first polymer may be about twice, about 3 times, about 4 times, about 5 times, about 7 times, or about 10 times larger than the weight ratio of hard structural units relative to soft structural units of the second polymer.

For example, the weight ratio of hard structural units relative to soft structural units of the first polymer (e.g., the weight ratio of the hard structural unit(s) of the first polymer relative to the soft structural unit(s) of the first polymer) may be larger than about 1 and within the range, greater than or equal to about 1.1, greater than or equal to about 1.2, greater than or equal to about 1.3, greater than or equal to about 1.4, greater than or equal to about 1.5, greater than or equal to about 1.7, greater than or equal to about 1.9, or greater than or equal to about 2.0, greater than about 1.0 and less than or equal to about 9.9, about 1.1 to about 9.9, about 1.2 to about 9.9, about 1.3 to about 9.9, about 1.4 to about 9.9, about 1.5 to about 9.9, about 1.7 to about 9.9, about 1.9 to about 9.9, or about 2.0 to about 9.9.

For example, the weight ratio of the hard structural unit relative to the soft structural unit of the second polymer (e.g., the weight ratio of the hard structural unit(s) of the second polymer relative to the soft structural unit(s) of the second polymer) may be smaller than about 1 and within the range, less than or equal to about 0.9, less than or equal to about 0.8, less than or equal to about 0.7, less than or equal to about 0.6, less than or equal to about 0.5, less than or equal to about 0.4, or less than or equal to about 0.3, about 0.01 to about 0.9, about 0.01 to about 0.8, about 0.01 to about 0.7, about 0.01 to about 0.6, about 0.01 to about 0.5, about 0.01 to about 0.4, or about 0.01 to about 0.3.

For example, the weight ratio of hard structural units relative to soft structural units of the second polymer may be greater than or equal to about 1.2, and the weight ratio of hard structural units relative to soft structural units of the first polymer may be less than or equal to about 0.7. For example, the weight ratio of hard structural units relative to soft structural units of the second polymer may be greater than or equal to about 1.5 and the weight ratio of hard structural units relative to soft structural units of the first polymer may be less than or equal to about 0.5.

The plurality of pixel circuits 120 are formed on the substrate 110.

Referring to FIG. 1, the plurality of pixel circuits 120 are repeatedly arranged on the substrate 110, and may be arranged around or in each pixel PX. For example, as shown in FIG. 1, the plurality of pixel circuits 120 may be provided as a repeating pattern (e.g., array) of pixel circuits on the substrate 110. Each pixel circuit 120 may include elements configured to enable independent control and/or driving of the pixel PX, and may include, for example, a plurality of thin film transistors (TFTs) and capacitors.

The plurality of thin film transistors may be electrically connected to the signal line, and the signal line may include a gate line transmitting a gate signal (or a scan signal), a data line transmitting a data signal, and/or a driving voltage line transmitting a driving voltage. At least a portion of the plurality of signal lines may be stretchable wires. The plurality of thin film transistors may include at least one switching TFT and at least one driving TFT.

A plurality of elements included in each pixel circuit 120 may be on the first region 110A and the second region 110B of the substrate 110. For example, a portion of the plurality of elements may be on the first region 110A of the substrate 110 having a relatively high elastic modulus, and a portion of the plurality of elements may be on the second region 110B of the substrate 110 having a relatively low elastic modulus. For example, a portion of the plurality of elements may be on the first region 110A (island-shaped region) of the substrate 110 overlapped with the pixel PX and a portion of the plurality of elements may be on the second region 110B (stretchable region) of the substrate 110 between adjacent pixels PX. Such portions of the plurality of elements that are "on" a given region may be understood to overlap (e.g., in the Z direction that extends perpendicular to the upper surface of the substrate 110 as shown in the figures) at least a portion of the given region. For example, as described herein, an element that is on the first region 110A may be understood to be directly or indirectly on the first region 110A and overlapping at least a portion of the first region 110A in the Z direction. In another example, as described herein, an element that is on the second region 110B may be understood to be directly or indirectly on the second region 110B and overlapping at least a portion of the second region 110B in the Z direction. In some example embodiments, an element that is on one region (e.g., second region 110B) may overlap at least a portion of the one region in the Z direction and may not overlap any portion of another region (e.g., the first region 110A) in the Z direction.

For example, a portion of the plurality of thin film transistors included in each pixel circuit 120 may be on the first region 110A (island-shaped region) of the substrate 110 having a relatively high elastic modulus and a portion of the plurality of thin film transistors included in each pixel circuit 120 may be on the second region 110B (stretchable region) of the substrate 110 having a relatively low elastic modulus. That is, a portion of the plurality of thin film transistors included in each pixel circuit 120 (e.g., at least one thin film transistor of the plurality of thin film transistors) may be in the pixel PX (e.g., may be on and overlap at least a portion of the first region 110A in the Z direction), and a portion of the plurality of thin film transistors included in each of the plurality of pixel circuits 120 (e.g., at least one thin film transistor of the plurality of thin film transistors) may be between adjacent pixels PX (e.g., may be on and overlap at least a portion of the second region 110B in the Z direction).

In this way, a portion of the plurality of thin film transistors included in each pixel circuit 120 is in an area other than the pixel PX (e.g., at least one thin film transistor may not overlap some portion or any portion of the first region 110A in the Z direction), so that in the pixels PX, an area (e.g., in the X and Y directions as shown in FIG. 1) occupied by one or more thin film transistors (e.g., a portion of the plurality of thin film transistors) may be reduced compared to a structure in which all the thin film transistors are in each pixel PX. Accordingly, the limitation of reducing the size of the pixel PX may be overcome and the size of the pixel may be effectively reduced, thereby enabling additional pixels in a given XY area, thereby enabling the flexible device 100 to provide higher resolution of an image displayed by the pixels PX of the flexible device 100.

Specifically, in the case of the flexible device 100 using a flexible substrate or a stretchable substrate as the substrate 110 as in some example embodiments, since a separate region (e.g., stretchable region) for providing flexibility and/or stretchability to the flexible device 100 should be secured, an area occupied by the pixel PX relative to the total area of the substrate 110 may be inevitably reduced compared to a general device (non-flexible device) using a glass substrate. Meanwhile, in general, the size of the pixel PX cannot be smaller than the area occupied by the pixel circuit 120. In some example embodiments, the area of the pixel circuit 120 in the pixel PX (e.g., in the XY plane as shown) may be effectively reduced by disposing a portion of the pixel circuit 120, that is, a portion of the thin film transistors (e.g., at least one thin film transistor) in an area other than the pixel PX (e.g., so that the at least one thin film transistor does not overlap the pixel PX, the unit device 130 that may at least partially define the pixel PX, and/or a first region 110A of the substrate in the Z direction) to overcome this limitation. Accordingly, the size of the pixel PX may also be effectively reduced. Accordingly, the limitation of the flexible device 100 may be overcome and the number of pixels PX per unit area on the substrate 110 may be increased to realize the flexible device 100 with high resolution, thereby improving operational performance (e.g., improved display resolution) of the flexible device 100 and/or an electronic device that includes the flexible device 100 (e.g., a display device).

For example, the plurality of thin film transistors included in each pixel circuit 120 may include a first portion, which may include a first thin film transistor 120*a*, on the first region 110A (island-shaped region) of the substrate 110 having a relatively high elastic modulus (e.g., the first thin film transistor 120*a* may overlap at least a portion of the first region 110A in the Z direction, which may extend perpendicular to an upper surface of the substrate 110) and may further include a second portion, which may include a second thin film transistor 120*b*, on the second region 110B (stretchable region) of the substrate 110 having a relatively low elastic modulus (e.g., the second thin film transistor 120*b* may overlap at least a portion of the second region 110B in the Z direction). In some example embodiments, the second thin film transistor 120*b* may overlap a portion of the second region 110B and may further at least partially overlap a portion of the first region 110A. In some example embodiments, the second thin film transistor 120*b* may be on the second region 110B (e.g., overlap at least a portion of the second region 110B in the Z direction) and may not be on the first region 110A (e.g., may not overlap any part of the first region 110A in the Z direction).

For example, the first thin film transistor 120*a* may be a non-stretchable thin film transistor including a non-stretchable semiconductor layer as an active layer, and the second thin film transistor 120*b* may be a stretchable thin film transistor including a stretchable semiconductor layer as an active layer. The non-stretchable semiconductor layer may include, for example, an inorganic semiconductor layer and may include, for example, silicon, an oxide semiconductor, or any combination thereof. The stretchable semiconductor layer may include, for example, an organic semiconductor, and may include, for example, a low molecular semiconductor, a polymer semiconductor, or any combination thereof. The stretchable semiconductor layer may include, for example, a semiconductor material and an elastomer. The semiconductor material may include, for example, an organic semiconductor, an oxide semiconductor, or any combination thereof, and the elastomer may include, for example, polydimethylsiloxane (PDMS), styrene-ethylene-butylene-styrene (SEBS), styrene-ethylene-propylene-styrene (SEPS), styrene-butadiene-styrene (SBS), styrene-isoprene-styrene (SIS), styrene-isobutylene-styrene (SIBS), or combination thereof, but are not limited thereto.

In some example embodiments, the organic semiconductor may be small molecule semiconductor, polymer semiconductor, or any combination thereof.

The small molecule semiconductor may include, for example, an aromatic compound and/or a heteroaromatic compound, for example, a fused polycyclic aromatic compound, a fused polycyclic heteroaromatic compound, or any combination thereof. The fused polycyclic aromatic compound may be for example pentacene, and the fused polycyclic heteroaromatic compound may include, for example, O, S, Se, Te, N, or a combination thereof.

The polymer semiconductor may include a structural unit including at least one electron donating moiety and at least one electron accepting moiety. The electron donating moiety may be, for example, a substituted or unsubstituted arylene group; a substituted or unsubstituted heterocyclic group; or a fused group thereof, for example, one or more substituted or unsubstituted phenylene; one or more substituted or unsubstituted naphthalene; one or more substituted or unsubstituted anthracenylene; one or more substituted or unsubstituted phenanthrenylene; one or more substituted or unsubstituted five-membered ring including N, O, S, Se, Te, Si; a fused ring of two or more of the substituted or unsubstituted five-membered rings; a fused ring of one or more substituted or unsubstituted five-membered ring and one or more substituted or unsubstituted phenylene; a fused ring of one or more substituted or unsubstituted five-membered ring and one or more substituted or unsubstituted naphthalene; a fused ring of one or more substituted or unsubstituted five-membered ring and one or more substituted or unsubstituted anthracenylene; a fused ring of one or more substituted or unsubstituted five-membered ring and one or more substituted or unsubstituted phenanthrenylene; or any combination thereof, but is not limited thereto. For example, the electron donating moiety may be one of the moieties listed in Group 1, but is not limited thereto.

[Group 1]

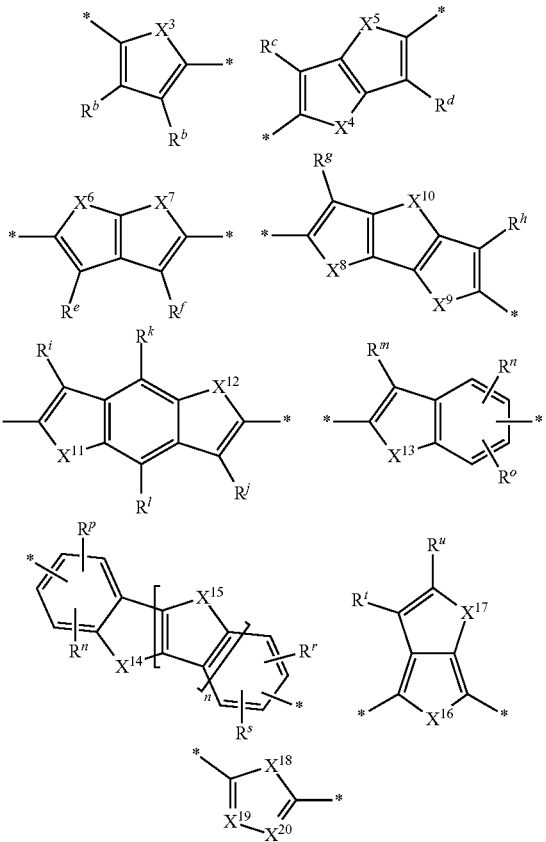

In Group 1, $X^3$ to $X^9$ and $X^{11}$ to $X^{20}$ are each independently O, S, Se, or Te, $X^{10}$ is O, S, Se, Te, $NR^v$, $CR^wR^x$, or $SiR^yR^z$, $R^a$ to $R^z$ are each independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C3 to C30 cycloalkenyl group, a substituted or unsubstituted C1 to C30 alkoxy group, a substituted or unsubstituted C3 to C30 cycloheteroalkyl group, a substituted or unsubstituted C3 to C30 a substituted or unsubstituted cycloheteroalkenyl group, a substituted or unsubstituted C6 to C30 aryl group, a substituted or unsubstituted C7 to C30 alkylaryl group, a substituted or unsubstituted C6 to C30 aryloxy group, a substituted or unsubstituted C3 to C30 heterocyclic group, a halogen, a cyano group, or any combination thereof, n is 0, 1 or 2, and

* is a linking point with a main chain of polymer.

The electron accepting moiety may be represented by Chemical Formula A, but is not limited thereto.

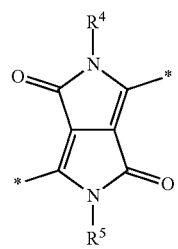

[Chemical Formula A]

In Chemical Formula A, $R^4$ and $R^5$ are each independently hydrogen, a substituted or unsubstituted C1 to C30 alkyl group, a substituted or unsubstituted C1 to C30 alkoxy group, a substituted or unsubstituted C2 to C30 alkoxyalkyl group, a substituted or unsubstituted C6 to C30 aryl group, —COR$^d$, —OCOR$^e$, —COOR$^f$, —OCOOR$^g$, a halogen, a cyano group, or any combination thereof, $R^d$ to $R^g$ are each independently hydrogen, a substituted or unsubstituted C1 to C30 alkyl group, a substituted or unsubstituted C1 to C30 alkoxy group, a substituted or unsubstituted C2 to C30 alkoxyalkyl group, a substituted or unsubstituted C6 to C30 aryl group, a halogen, a cyano group, or any combination thereof, and

* is a linking point with a main chain of polymer.

The electron donating moiety and the electron accepting moiety may be directly linked to each other or linked with a linker therebetween. The linker may include, for example, one or more substituted or unsubstituted furan; one or more substituted or unsubstituted thiophene; one or more substituted or unsubstituted selenophene; one or more substituted or unsubstituted tellurophene; one or more substituted or unsubstituted pyrrole; one or more substituted or unsubstituted benzene; one or more substituted or unsubstituted pyridine; one or more substituted or unsubstituted pyrimidine; or a fused ring thereof; or any combination thereof, but is not limited thereto.

The weight average molecular weight of the polymer semiconductor may be about 5,000 Da to about 500,000 Da, and within the above range, it may be about 10,000 Da to about 300,000 Da, or about 30,000 Da to about 200,000 Da.

In some example embodiments, the polymer semiconductor may be a material having a chemical formula as represented by Chemical Formula AA below.

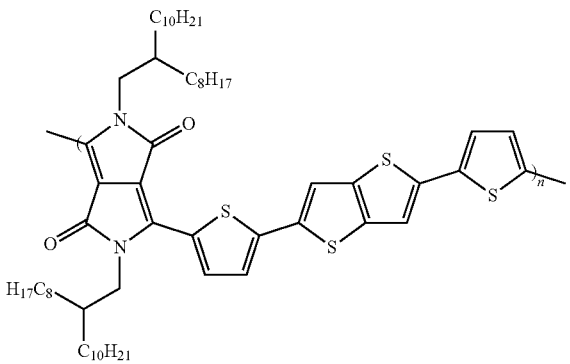

<Chemical Formula AA>

Accordingly, the non-stretchable thin film transistor may be on the first region 110A of the substrate 110 having a relatively high elastic modulus (e.g., about $10^3$ Pa to about $10^{12}$ Pa) to prevent damage due to an external force such as stretching, and the stretchable thin film transistor may be on the second region 110B of the substrate 110 having a relatively low elastic modulus (e.g., about 100 Pa to about $10^9$ Pa, about 100 Pa to about $10^3$ Pa, etc.) to flexibly respond to an external force such as stretching. Accordingly, the area occupied by the thin film transistor in the pixel PX may be effectively reduced to implement a high-resolution flexible device as described above.

For example, one of the first thin film transistor 120a and the second thin film transistor 120b may be a switching thin film transistor and the other may be a driving thin film transistor. For example, the first thin film transistor 120a may be a driving thin film transistor and the second thin film transistor 120b may be a switching thin film transistor. The switching thin film transistor may be electrically connected to the gate line and the data line and may control the on/off of the pixel PX, and the driving thin film transistor may be electrically connected to the switching thin film transistor and the driving voltage line and may drive the pixel PX.

For example, the switching thin film transistor may include a first gate electrode electrically connected to the gate line; a first source electrode electrically connected to the data line; a first drain electrode facing the first source electrode; and a first semiconductor layer electrically connected to the first source electrode and the first drain electrode, respectively. For example, the driving thin film transistor may include a second gate electrode electrically connected to the first drain electrode; a second source electrode connected to the driving voltage line; a second drain electrode facing the second source electrode; and a second semiconductor layer electrically connected to the second source electrode and the second drain electrode, respectively. The switching thin film transistor and the driving thin film transistor may include the same or different semiconductor layers.

For example, the driving thin film transistor may require high charge transfer characteristics, and may include a silicon semiconductor layer, an oxide semiconductor layer, or any combination thereof having such high charge transfer characteristics as an active layer. Since the silicon semiconductor layer and/or the oxide semiconductor layer is a non-stretchable semiconductor layer as described above, the driving thin film transistor may be the first thin film transistor 120a on the first region 110A (island-shaped region) of the substrate 110.

For example, the switching thin film transistor may be required of low leakage current characteristics for high on/off characteristics, and thus may include an organic semiconductor layer, an oxide semiconductor layer, or any combination thereof having such low leakage current characteristics as an active layer. Since the organic semiconductor layer and the oxide semiconductor layer may be stretchable semiconductor layers as described above, the switching thin film transistor may be the second thin film transistor 120b on the second region 110B (stretchable region) of the substrate 110. The oxide semiconductor layers of the switching thin film transistor and the driving thin film transistors may be, respectively, a first oxide semiconductor layer and a second oxide semiconductor layer. The first and second oxide semiconductor layers may be the same oxide semiconductor layer or different oxide semiconductor layers.

Referring to FIG. 3, the second thin film transistor 120b may be a switching thin film transistor, and may include a first gate electrode 124, a gate insulator 142, a first source electrode 173, a first drain electrode 175, and a first semiconductor layer 154 on the substrate 110. The first gate electrode 124, the first source electrode 173, and the first drain electrode 175 may be on the second region 110B (stretchable region) of the substrate 110 and may each include a stretchable conductor. The gate insulator 142 may be, for example, a stretchable insulator. The signal lines or electrodes 180a and 180b electrically connected to the first source electrode 173 and the first drain electrode 175, respectively, may be on, for example, the first region 110A (non-stretchable region) of the substrate 110 and may each include a non-stretchable conductor.

In FIG. 1, the first thin film transistor 120a and the second thin film transistor 120b are shown in arbitrary shapes and sizes for convenience of explanation, but the shape and size of the first thin film transistor 120a and the second thin film transistor 120b may vary. Also, in FIG. 1, for better comprehension and ease of description, the first thin film transistor 120a and the second thin film transistor 120b are shown at arbitrary positions, but the first thin film transistor 120a may be anywhere on (e.g., overlapping in the Z direction) the first region 110A (island-shaped region) of the substrate 110 and the second thin film transistor 120b may be anywhere on (e.g., overlapping in the Z direction) the second region 110B (stretchable region) of the substrate 110.

For example, the number of second thin film transistors 120b included in each pixel circuit 120 may be equal to or smaller than the number of first thin film transistors 120a included in each pixel circuit 120. For example, the number of second thin film transistors 120b included in each pixel circuit 120 may be greater than the number of first thin film transistors 120a included in each pixel circuit 120. For example, the number of first thin film transistors included in each pixel circuit 120 may be 1 to 10. For example, the number of second thin film transistors included in each pixel circuit 120 may be 1 to 10.

The plurality of unit devices 130 may be arranged on the substrate 110, and each unit pixel 130 may define or substantially define a pixel PX (e.g., the boundaries of a unit pixel 130 in the X and Y directions as shown in at least FIG. 1 may define the boundaries of a corresponding pixel PX in at least the X and Y directions as shown in at least FIG. 1). Each unit device 130 may be on (e.g., may vertically overlap in the Z direction) at least a portion of the first region 110A of the substrate 110. The plurality of unit devices 130 may be arranged along rows and/or columns to form the unit device array 130A. The unit device array 130A may be arranged, for example, in a Bayer matrix, a pentile matrix, and/or a diamond matrix, similarly to the arrangement of the pixels PX, but is not limited thereto.

The plurality of unit devices 130 may be the same or different from each other, and each unit device 130 may be a light emitting diode such as an organic light emitting diode, an inorganic light emitting diode, a quantum dot light emitting diode, a micro light emitting diode, or a perovskite light emitting diode or a photoelectric conversion diode such as an organic photoelectric conversion diode, an inorganic photoelectric conversion diode, or an organic-inorganic photoelectric conversion diode, or any combination thereof.

For example, each unit device 130 may be a light emitting diode that independently displays red, green, blue, or any combination thereof.

Referring to FIG. 4, the unit device 130 may be a light emitting diode, and may include an anode 131; a cathode 132; a light emitting layer 133 between the anode 131 and the cathode 132, and optionally auxiliary layers 134a and 134b between the anode 131 and the light emitting layer 133 and/or between the cathode 132 and the light emitting layer 133.

At least one of the anode 131 or the cathode 132 may be a light-transmitting electrode. For example, the anode 131 may be a light-transmitting electrode and the cathode 132 may be a reflective electrode. For example, the anode 131 may be a reflective electrode and the cathode 132 may be a light-transmitting electrode. For example, the anode 131 and the cathode 132 may each be a light-transmitting electrode. At least one of the anode 131 or the cathode 132 may be a stretchable electrode. The stretchable electrode may include, for example, stretchable conductors or have a stretchable shape such as a wavy shape, a pleat shape, a pop-up shape, or a non-planar mesh shape. The stretchable electrode may have, for example, a plurality of microcracks. Since the plurality of microcracks are separated from each other like small holes, flexibility may be imparted to the stretchable electrode by extending along the stretching direction during stretching while maintaining the electrical movement path in the stretchable electrode.

The light emitting layer 133 may be configured to emit light in a red wavelength spectrum, a green wavelength spectrum, a blue wavelength spectrum, an infrared wavelength spectrum, or any combination thereof, and may include, for example, an organic light emitting layer, an inorganic light emitting layer, an organic/inorganic light emitting layer, or any combination thereof. The light emitting layer 133 may include at least one host material and at least one dopant.

The auxiliary layers 134a and 134b may be, for example, charge auxiliary layers, and may be, for example, a hole transport layer, a hole injection layer, an electron blocking layer, an electron transport layer, an electron injection layer, a hole blocking layer, or any combination thereof, but is not limited thereto.

For example, each unit device 130 may be a photoelectric conversion diode configured to absorb and photoelectrically convert light in a red wavelength spectrum, a green wavelength spectrum, a blue wavelength spectrum, an infrared wavelength spectrum, or any combination thereof.

Referring to FIG. 5, the unit device 130 may be a photoelectric conversion diode, and the photoelectric conversion diode may include an anode 135; a cathode 136; a photoelectric conversion layer 137 between the anode 135 and the cathode 136, and optionally auxiliary layers 138a and 138b between the anode 135 and the photoelectric conversion layer 137 and/or between the cathode 136 and the photoelectric conversion layer 137.

The anode 135 and the cathode 136 are as described above. The photoelectric conversion layer 137 may be configured to absorb light of a red wavelength spectrum, a green wavelength spectrum, a blue wavelength spectrum, an infrared wavelength spectrum, or any combination thereof, and may be configured to convert the absorbed light into an electrical signal. The photoelectric conversion layer 137 may be, for example, an organic photoelectric conversion layer, an inorganic photoelectric conversion layer, an organic-inorganic photoelectric conversion layer or any combination thereof. The photoelectric conversion layer 137 may include a p-type semiconductor and an n-type semiconductor, and the p-type semiconductor and the n-type semiconductor may form a pn junction.

The auxiliary layers 138a and 138b may be, for example, a charge auxiliary layer and/or an optical auxiliary layer, such as a hole extraction layer, an electron blocking layer, an electron extraction layer, a hole blocking layer, a light absorption auxiliary layer, or any combination thereof, but the present inventive concepts are not limited thereto.

For example, a portion of the plurality of unit devices 130 may be a light emitting diode, and a portion of the plurality of unit devices 130 may be a photoelectric conversion diode.

For example, a portion of the plurality of unit devices 130 may be a light emitting diode, a portion of the plurality of unit devices 130 may be a photoelectric conversion diode, and a portion of the plurality of unit devices 130 may be an auxiliary device such as a pressure sensor.

Referring to FIGS. 1-5, the unit device array 130A may include a plurality of unit devices 130 that are each electrically connected to a separate pixel circuit 120 of the plurality of pixel circuits. Each separate unit device 130 may at least partially vertically overlap (e.g., at least partially overlap in the Z direction) the respective pixel circuit to which the separate unit device 130 is electrically connected. As shown in at least FIG. 1, the connecting wire 140 may be on the second region 110B (e.g., the stretchable region) of the substrate 110 and may be, for example, a stretchable wire. The connecting wire 140 may be between the adjacent unit devices 130 to electrically connect the adjacent unit devices 130. The connecting wire 140 may be one or two or more, and may be arranged in a row direction (e.g., X direction) and column direction (e.g., Y direction) between the unit devices 130 arranged along rows and/or columns. The connecting wire 140 may be connected to a signal line (not shown). The signal line may include, for example, a gate line transmitting a gate signal (or a scan signal), a data line transmitting a data signal, a driving voltage line applying a driving voltage, and/or a common voltage line applying a common voltage, but are not limited thereto.

The connecting wire 140 may include, for example, a low-resistance conductor, for example, silver, gold, copper, aluminum, or an alloy thereof. In the drawings, the connecting wire 140 is shown in a straight shape for convenience, but the present inventive concepts are not limited thereto and may have a serpentine or zigzag shape. The connecting wire 140 may be omitted.

The flexible device 100 may be, for example, a display panel or a sensor array depending on the unit device 130. For example, when the unit device 130 is a light emitting diode, the flexible device 100 may be a display panel. For example, when the unit device 130 includes a photoelectric conversion diode and optionally further includes a light emitting diode, the flexible device 100 may be a sensor array.

The flexible device 100, as described above, may reduce a pixel size by disposing a portion of the pixel circuits 120 (e.g., second thin film transistors 120b) in an area other than pixels PX and thus increase the number of the pixels per unit area. For example, the flexible device 100 may be a display panel or a sensor array, and the number (e.g., quantity) of the pixels per unit area of the display panel or sensor array may be greater than or equal to about 150 ppi (pixel per inch), greater than or equal to about 200 ppi, greater than or equal to about 250 ppi, greater than or equal to about 300 ppi, greater than or equal to about 350 ppi, greater than or equal to about 400 ppi, greater than or equal to about 450 ppi, or greater than or equal to about 500 ppi, for example, about 150 ppi to about 1000 ppi, about 200 ppi to about 1000 ppi, about 250 ppi to about 1000 ppi, about 300 ppi to about 1000 ppi, about 350 ppi to about 1000 ppi, about 400 ppi to about 1000 ppi, about 450 ppi to about 1000 ppi, or about 500 ppi to about 1000 ppi.

Hereinafter, another example of the flexible device is described.

Figure 6:
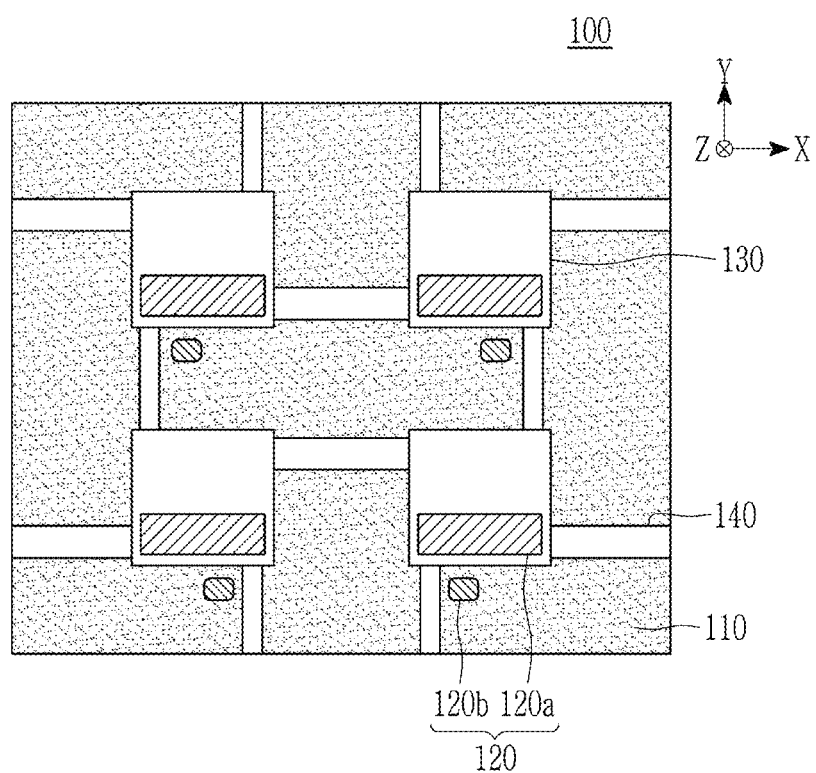
FIG. 6 is a plan view showing another example of a flexible device according to some example embodiments.
Figure 7:
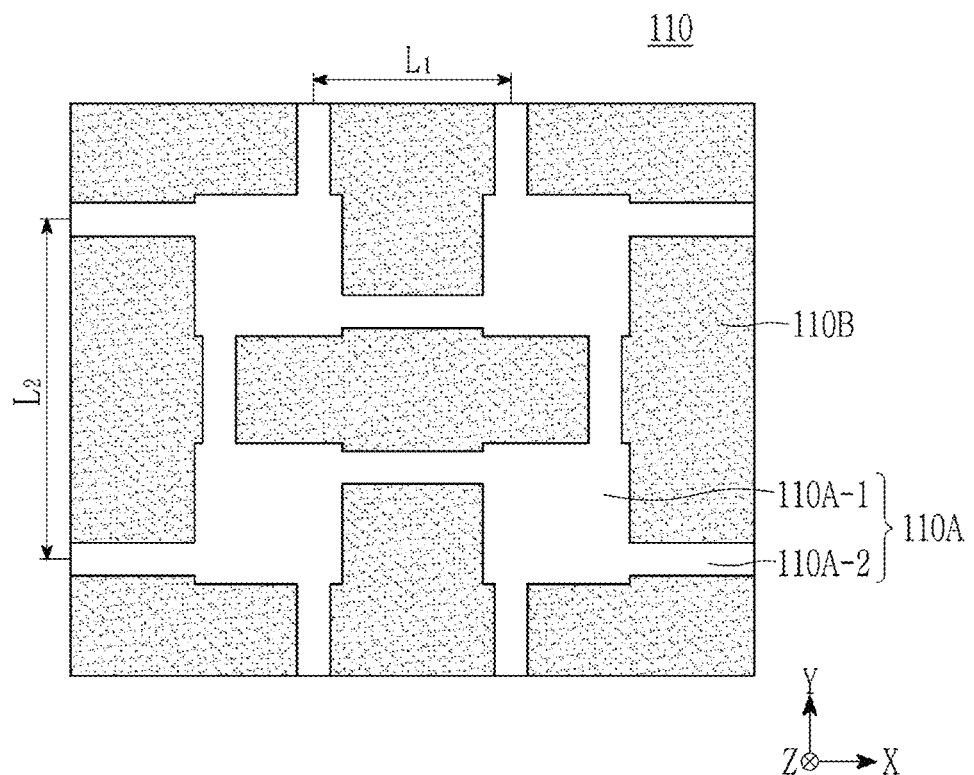
FIG. 7 is a plan view illustrating an example of a substrate included in the flexible device of FIG. 6 according to some example embodiments.

FIG. 6 is a plan view showing another example of a flexible device according to some example embodiments, and FIG. 7 is a plan view illustrating an example of a substrate included in the flexible device of FIG. 6 according to some example embodiments.

Referring to FIG. 6, the flexible device 100, like some example embodiments, including the example embodiments shown in FIGS. 1-5, includes the substrate 110, a plurality of the pixel circuits 120, the unit device 130 and the connecting wire 140.

The flexible device 100 according to some example embodiments, like some example embodiments, including the example embodiments shown in FIGS. 1-5, may include a plurality of pixels PX, and each pixel PX may be defined by the unit device 130.

The substrate 110 may be, as described above, a flexible substrate or a stretchable substrate.

Referring to FIG. 7, the substrate 110 may include, as described above, a first region 110A having a relatively high elastic modulus (a first elastic modulus) and a second region 110B having a relatively low elastic modulus (a second elastic modulus).

The first region 110A of the substrate 110 may include a plurality of island-shaped regions 110A-1 arranged at a particular (or, alternatively, predetermined) interval and one or more connection regions 110A-2 connecting the plurality of the island-shaped regions 110A-1. The island-shaped regions 110A-1 may be spaced apart from each other at a particular (or, alternatively, predetermined) interval and arranged along a plane direction (e.g., XY direction) of the substrate 110. Each island-shaped region 110A-1 may correspond to each pixel PX and overlap each unit device 130, and each connection region 110A-2 may be a region where the connecting wire 140, which is described later, may be disposed.

A second region 110B of the substrate 110 may be a stretchable region. In the second region 110B of the substrate 110, a plurality of incision lines (not shown) deformable by an external force (e.g., configured to be deformable by an external force) may be formed, such that the second region 110B is understood to include the plurality of incision lines. The incision lines may be widened or twisted, that is, geometrically deformable by stretching of the substrate 110 and thus provide the substrate 110 with flexibility and/or stretchability. A plurality of the incision lines may have a shape, a location, and/or a size geometrically pre-calculated and determined by considering a stretching direction of the substrate 110, disposition of the unit device 130, and the like. The plurality of incision lines may be repeatedly arranged along the in-plane direction (e.g., XY direction) of the substrate 110, and thus, when stretched in a particular (or, alternatively, predetermined) direction (e.g., X and/or Y direction), repeat geometrical deformation on the substrate 110 may occur. Such a structure may be called a so-called "kirigami structure", and the incision lines and adjacent patterns (cut patterns) divided by the incision lines may be widen, stretched, or twisted, and accordingly, a separation distance between adjacent patterns (cut patterns) may be changed according to the presence or absence of stretching or the strength of stretching. For example, the separation distances $L_1$ and $L_2$ between the adjacent connection regions 110A-2 may be changed according to the presence or absence of stretching or the strength of stretching. Due to the two-dimensional and/or three-dimensional structural deformation, stretching and restoration in the stretching direction may be easy, so that effective stretchability may be provided to the second region 110B of the substrate 110.

Detailed descriptions of materials of the first region 110A and the second region 110B of the substrate 110 are the same as described above.

Referring to FIG. 6, a plurality of the pixel circuits 120 are repeatedly arranged on the substrate 110 and disposed around or in each pixel PX. Each pixel circuit 120 may include elements that may be used and/or may be needed to independently control and/or drive the pixels PX, for example, a plurality of thin film transistors and capacitors. For example, each pixel circuit 120 may include a plurality of transistors and a capacitor. The plurality of thin film transistors may include at least one switching thin film transistor and at least one driving thin film transistor.

A plurality of elements included in each pixel circuit 120 may be on the first region 110A and the second region 110B of the substrate 110. For example, a portion of the plurality of elements may be on the first region 110A having a relatively high elastic modulus on the substrate 110, and a portion of the plurality of elements may be on the second region 110B having a relatively low elastic modulus on the substrate 110. For example, a portion of the plurality of elements may be on the first region 110A of the substrate 110 which is overlapped with the pixels PX and others of the plurality of elements may be on the second region 110B of the substrate 110 which is between adjacent pixels PX.

For example, a portion of the plurality of thin film transistors included in each pixel circuit 120 may be on the first region 110A (island-shaped region) having a relatively high elastic modulus on the substrate 110, and others of the plurality of thin film transistors included in each pixel circuit 120 may be on second region 110B (stretchable region) having a relatively low elastic modulus on the substrate 110. In other words, a portion of the plurality of thin film transistor included in each pixel circuit 120 may be in the pixel PX, and others of the plurality of thin film transistors included in each pixel circuit 120 may be between adjacent pixels PX. In this way, a portion of the plurality of thin film transistor included in each pixel circuit 120 are in a region other than the pixels PX, so that in the pixels PX, an area occupied by the thin film transistors may be reduced, compared to a structure that all the thin film transistors are in each pixel PX. Accordingly, the limitation of reducing the size of the pixel PX may be overcome and the size of the pixel may be effectively reduced.

For example, the plurality of thin film transistors included in each pixel circuit 120 may include a first thin film transistor 120a on the first region 110A (island-shaped region) having a relatively high elastic modulus on the substrate 110 and a second thin film transistor 120b on the second region 110B (stretchable region) having a relatively low elastic modulus on the substrate 110.

For example, the first thin film transistors 120a may be a non-stretchable thin film transistor including a non-stretchable semiconductor layer as an active layer, and the second thin film transistors 120b may be a stretchable thin film transistor including a stretchable semiconductor layer as an active layer. The non-stretchable semiconductor layer may include, for example, an inorganic semiconductor layer, for example, silicon, an oxide semiconductor, or any combination thereof. The stretchable semiconductor layer may include, for example, an organic semiconductor, a low molecular semiconductor, a polymer semiconductor, or any combination thereof. Descriptions of the stretchable semiconductor layer and the non-stretchable semiconductor layer are the same as described above.

For example, either one of the first thin film transistor 120a or the second thin film transistor 120b may be a switching thin film transistor, and the other may be a driving thin film transistor.

For example, the driving thin film transistor may require high charge transfer characteristics and may include a silicon semiconductor layer, an oxide semiconductor layer, or any combination thereof having such high charge transfer characteristics as an active layer. Since the silicon semiconductor layer and/or the oxide semiconductor layer is a non-stretchable semiconductor layer as described above, the driving thin film transistor may be the first thin film transistor 120a on the first region 110A (island-shaped region) of the substrate 110.

For example, the switching thin film transistor may be required of low leakage current characteristics for high on/off characteristics and thus may include an organic semiconductor layer having such low leakage current characteristics as an active layer. Since the organic semiconductor layer may be, as described above, a stretchable semiconductor layer, the switching thin film transistor may be the second thin film transistor 120b disposed on the second region 110B (stretchable region) on the substrate 110. For example, where a pixel circuit 120 includes a capacitor in addition to the thin film transistors that include a driving thin film transistor and a switching thin film transistor, the capacitor, the driving thin film transistor, and one unit device 130 may be on (e.g., vertically overlap in the Z direction) the first region 110A of the substrate 110 and the switching thin film transistor may be on (e.g., vertically overlap in the Z direction) the second region 110B of the substrate 110.

In FIG. 6, the first thin film transistor 120a and the second thin film transistor 120b are shown in arbitrary shapes and sizes for convenience of explanation, but the shape and size of the first thin film transistor 120a and the second thin film transistor 120b may vary. In addition, in FIG. 6, for better comprehension and ease of description, the first thin film transistor 120a and the second thin film transistor 120b are disposed at a specific position, but the first thin film transistor 120a may be anywhere in the first region 110A (island-shaped region) of the substrate 110, and the second thin film transistor 120b may be anywhere in the second region 110B (stretchable region) of the substrate 110.

For example, the second thin film transistor 120b may be in a region having relatively less stress out of the second region 110B (stretchable region) of the substrate 110, and this region having relatively less stress may be variously selected according to arrangement and spacing of the unit devices 130. For example, the second thin film transistor 120b may be between the island-shaped region 110A-1 and the connection region 110A-2 of the substrate 110.

The plurality of unit devices 130 may be arranged on the substrate 110, and each unit pixel 130 may substantially define a pixel PX. The plurality of unit devices 130 may be the same or different from each other, and as described above, each unit device 130 may be a light emitting diode such as an organic light emitting diode, an inorganic light emitting diode, a quantum dot light emitting diode, a micro light emitting diode, or a perovskite light emitting diode or a photoelectric conversion diode such as an organic photoelectric conversion diode, an inorganic photoelectric conversion diode, or an organic-inorganic photoelectric conversion diode. Detailed descriptions are the same as described above.

The connecting wire 140 may be on the connection region 110A-2 of the substrate 110. The connecting wire 140 may be between the adjacent unit devices 130 (e.g., between adjacent unit devices 130 that are at least partially on and/or vertically overlap separate, respective adjacent island-shaped regions 110A-1) to electrically connect the adjacent unit devices 130. The connecting wire 140 may be one or two or more, and may be arranged in a row direction (e.g., X direction) and column direction (e.g., Y direction) between the unit devices 130 arranged along rows and/or columns. The connecting wire 140 may be connected to a signal line (not shown). The signal line may include, for example, a gate line transmitting a gate signal (or a scan signal), a data line transmitting a data signal, a driving voltage line applying a driving voltage, and/or a common voltage line applying a common voltage, but are not limited thereto. The connecting wire 140 may be a stretchable wire or a non-stretchable wire.

The aforementioned flexible device 100 may be various flexible devices requiring flexibility and/or stretchability, for example, a display panel or a sensor array. The flexible device 100 may be, for example, a bendable display panel, a foldable display panel, a rollable display panel, a wearable device, a skin-like display panel, a skin-like sensor, a large-area conformable display, smart clothing, and the like, but is not limited thereto.

The flexible devices 100 or portions thereof as shown in FIGS. 1-8 may be shown to include multiple pixel circuits 120 and unit devices 130 on a substrate, but it will be understood that example embodiments are not limited thereto. For example, in some example embodiments, a flexible device may include a substrate 110 including a first region 110A and a second region 110B, the first region 110A having a first elastic modulus and the second region 110B having a second elastic modulus that is lower than the first elastic modulus, a pixel circuit 120 (e.g., a single pixel circuit 120 or multiple pixel circuits 120) on the substrate, the pixel circuit 120 including a plurality of thin film transistors (e.g., first and second thin film transistors 120a and 120b), at least one thin film transistor (e.g., second thin film transistor 120b, which may be a switching thin film transistor) being on the second region 110B of the substrate 110 such that the at least one thin film transistor is not on the first region 110A of the substrate 110; and a unit device 130 (e.g., one unit device 130 or multiple unit devices 130) on the first region 110A of the substrate, the unit device 130 electrically connected to the pixel circuit 120 (e.g., where the flexible device 100 includes multiple pixel circuits 120, for example pixel circuits 120 each including a separate plurality of thin film transistors that are partially on a separate island-shaped region of a plurality of island-shaped regions of the first region 110A, the flexible device 100 may further include a plurality of unit devices 130 that are each electrically connected to a separate pixel circuit 120 of the plurality of pixel circuits 120). The at least one thin film transistor (e.g., second thin film transistor 120b) may overlap at least a portion of the second region 110B of the substrate 110 in a direction extending perpendicular to an upper surface of the substrate 110 (e.g., the Z direction). The at last one thin film transistor (e.g., second thin film transistor 120b) may or may not overlap any portion of the first region 110A in the same direction (e.g., the Z direction).

Figure 8:
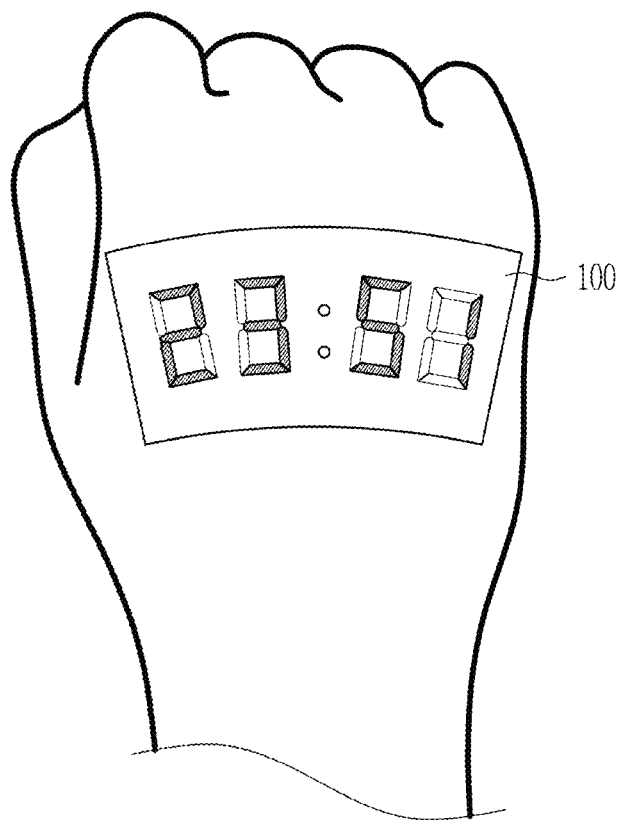
FIG. 8 is a schematic diagram showing a skin type display panel according to some example embodiments.
Figure 9A:
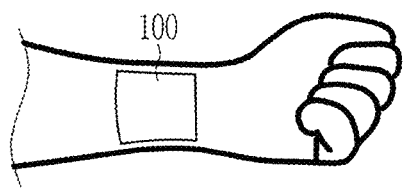
FIGS. 9A, 9B, and 9C are schematic views showing a sensor array according to some example embodiments.
Figure 9B:
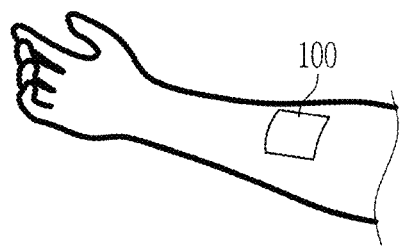
Figure 9C:
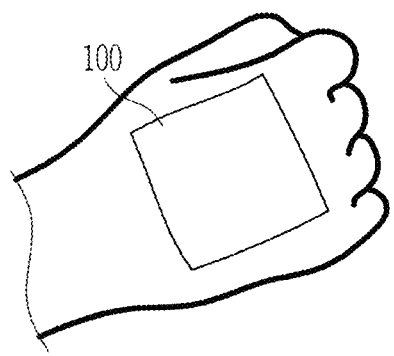

FIG. 8 is a schematic diagram showing a skin-type display panel according to some example embodiments, and FIGS. 9A, 9B, and 9C are schematic views showing a sensor array according to some example embodiments.

Referring to FIG. 8, the aforementioned flexible device 100 may be a skin-type display panel that is an ultrathin display panel, and may display particular (or, alternatively, predetermined) information such as various characters and/or images.

Referring to FIGS. 9A to 9C, the aforementioned flexible device 100 may be a wearable biosensor array and may be attached to a living body such as skin, a living body such as an organ, or an indirect means in contact with a living body such as clothes to sense and measure biometric information such as a biosignal. For example, the biosensor array may include an electroencephalogram (EGG) sensor, an electrocardiogram (ECG) sensor, a blood pressure (BP) sensor, an electromyography (EMG) sensor, a blood glucose (BG) sensor, a photoplethysmography (PPG) sensor, an accelerometer, a RFID antenna, an inertial sensor, an activity sensor, a strain sensor, a motion sensor, or a combination of these, but is not limited thereto. The biosensor array may be attached to a living body in a very thin patch-type or band-shaped form, so that the biological information may be monitored in real time.

As an example, the flexible device 100 may be a sensor array including a photoplethysmography sensor (PPG sensor), and the biological information may include a heart rate, oxygen saturation, stress, arrhythmia, blood pressure, and the like, and may be obtained by analyzing waveforms of electric signals.

For example, the flexible device 100 may be a sensor array including an electromyography (EMG) sensor or a strain sensor attached to a joint for rehabilitation treatment of patients with joint and muscle problems. The electromyography (EMG) sensor or the strain sensor may be attached to a desired site to quantitatively measure muscle movement or joint movement to secure data necessary for rehabilitation.

The aforementioned flexible device 100 may be included in various electronic devices, and the electronic devices may further include a processor (not shown) and a memory (not shown). The electronic devices may be a mobile; TV; a health care device, and the like, and the health care device may include, for example, a photoplethysmography (PPG) sensor device, an electroencephalogram (EEG) sensor device, an electrocardiogram (ECG) sensor device, a blood pressure (BP) sensor device, an electromyography (EMG) sensor device, a blood glucose (BG) sensor device, an accelerometer, a RFID antenna, an inertial sensor, an activity sensor, a strain sensor, a motion sensor, or any combination thereof, but is not limited thereto.

Figure 11:
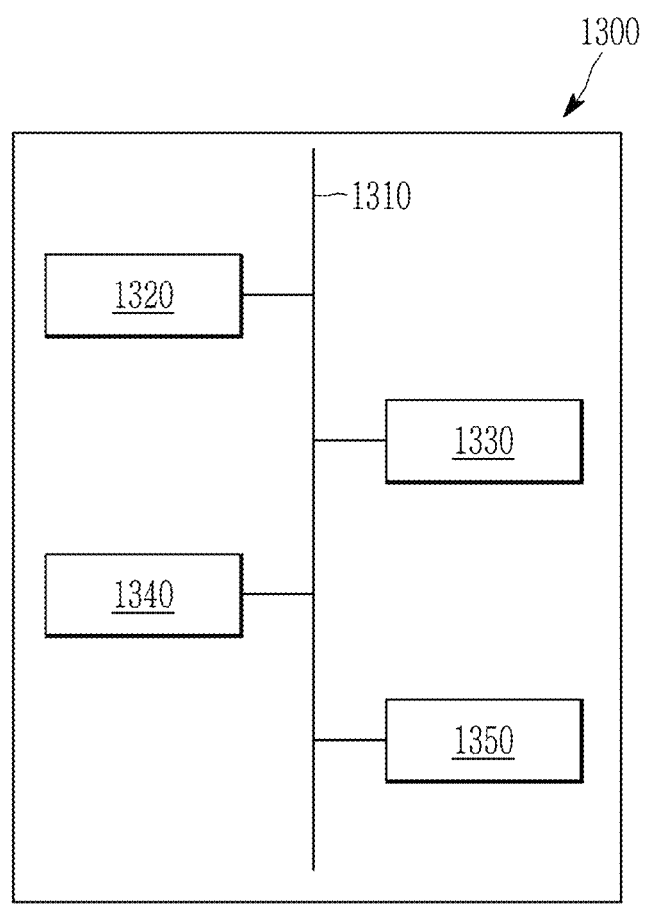
FIG. 11 is a schematic diagram of an electronic device according to some example embodiments.

FIG. 11 is a schematic diagram of an electronic device 1300 according to some example embodiments. The electronic device 1300 shown in FIG. 11 may be an electronic device according to any of the example embodiments.

Referring to FIG. 11, an electronic device 1300 includes a processor 1320, a memory 1330, a sensor 1340, and a display device 1350 electrically connected through a bus

1310. The sensor 1340 may be any of the sensors according to any of the example embodiments. The display device 1350 may be any of the display panels according to any of the example embodiments. In the example embodiments shown in FIG. 11, the electronic device 1300 may include both a sensor 1340 and a display device 1350, but example embodiments are not limited thereto: in some example embodiments the electronic device 1300 may include one of the sensor 1340 or the display device 1350.

In some example embodiments, some or all of the electronic device 1300 may include or be included in a flexible device according to any of the example embodiments. For example, in some example embodiments, the electronic device 1300 may include a flexible device 100 according to any of the example embodiments that includes at least one of the sensor 1340 or the display device 1350, and the memory 1330, processor 1320, and bus 1310 may be on the substrate 110 of the flexible device 100 and coupled to the unit device array 130A of the flexible device 100. In some example embodiments, the flexible device 100 may be limited to the sensor 1340 and/or display device 1350 included in the electronic device 1300, wherein the bus 1310, memory 1330, and processor 1320 are external to the flexible device 100 and coupled thereto (e.g., via bus 1310) to establish the electronic device 1300.

The processor 1320 may perform a memory program and thus at least one function, including controlling the sensor 1340 and/or displaying an image on the display device 1350. The processor 1320 may generate an output.

As described herein, any devices, systems, electronic devices, blocks, modules, units, controllers, circuits, and/or portions thereof according to any of the example embodiments, and/or any portions thereof (including, without limitation, flexible device 100, electronic device 1300, processor 1320, memory 1330, sensor 1340, display device 1350, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, systems, electronic devices, blocks, modules, units, controllers, circuits, and/or portions thereof according to any of the example embodiments, and/or any portions thereof.

Any of the memories and/or storage devices described herein, including, without limitation, memory 1330, or the like, may be a non-transitory computer readable medium and may store a program of instructions. Any of the memories described herein may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM).

Hereinafter, some example embodiments are illustrated in more detail with reference to examples. However, the scope of the inventive concepts is not limited to these claims.

EXAMPLES

Example 1

Au is thermally deposited on a styrene-ethylene-butylene-styrene (SEBS) substrate to form a gate electrode, and a SEBS solution is applied thereon and annealed at 100° C. for 0.5 hours to form a gate insulator. An organic semiconductor represented by Chemical Formula AA and SEBS (elastomer) in a weight ratio of 3:7 are mixed in chlorobenzene at a concentration of 0.6 wt % to prepare an organic semiconductor solution, and the obtained organic semiconductor solution is spin-coated on the gate insulator to be 1000 Å thick at 1000 rpm and then heat-treated under a nitrogen atmosphere at 100° C. for 1 hour to form an organic semiconductor layer. Subsequently, Au is thermally deposited on the organic semiconductor layer to form a source electrode and a drain electrode, manufacturing a thin film transistor. The thin film transistor has a width/length ratio of 25/10.

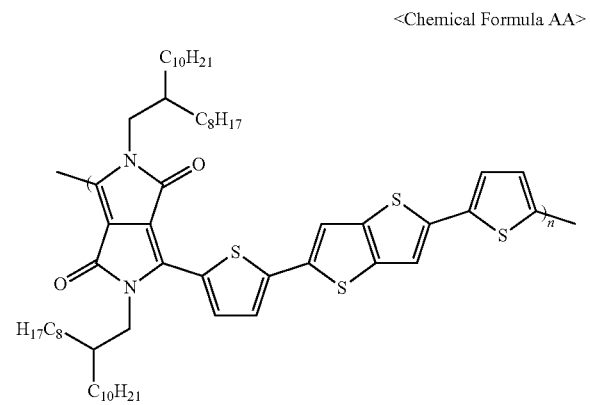

<Chemical Formula AA>

Example 2

A thin film transistor is manufactured according to the same method as Example 1 except that the width/length ratio of the thin film transistor is changed to 245/10.

Evaluation

Electric characteristics according to stretching of the thin film transistors of Examples are evaluated.

The electric characteristics are evaluated from current changes according to the stretching, while the thin film transistors of Examples are 1000 times repeatedly stretched (by 50% of an initial length) ($V_G$=−20 V).

Figure 10:
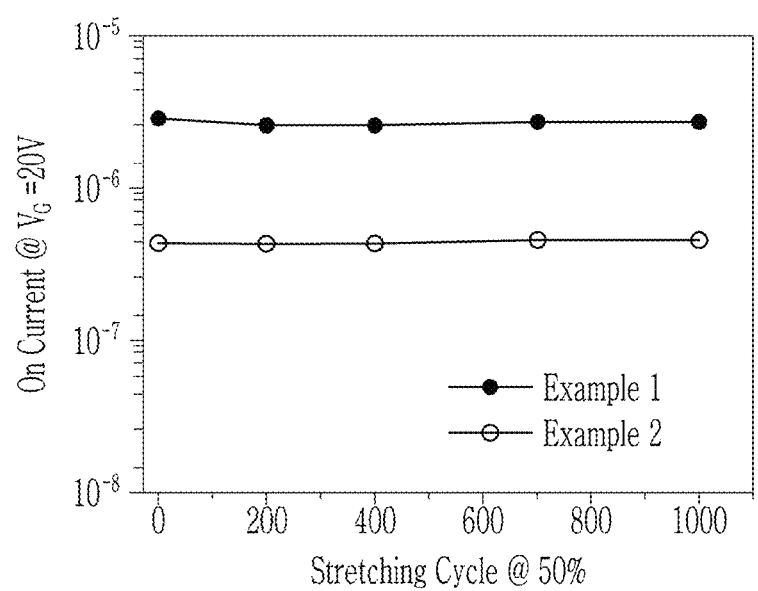
FIG. 10 is a graph showing electrical characteristics according to stretching of the thin film transistor according to Examples according to some example embodiments.

The results are shown in FIG. 10.

FIG. 10 is a graph showing electrical characteristics of the thin film transistors according to stretching according to Examples according to some example embodiments.

Referring to FIG. 10, after 1000 times repeatedly stretching the thin film transistors of Examples, the initial current characteristics are substantially maintained. Accordingly, the thin film transistors of Examples exhibit high electrical stability according to stretching.

While the inventive concepts have been described in connection with what is presently considered to be practical example embodiments, it is to be understood that the inventive concepts are not limited to such example embodiments. On the contrary, the scope of the inventive concepts is intended to cover various modifications and equivalent arrangements included within the spirit and scope of the appended claims.

What is claimed is:

1. A flexible device, comprising:
a substrate including a first region and a second region, the first region having a first elastic modulus and the second region having a second elastic modulus that is lower than the first elastic modulus;
a plurality of pixel circuits spaced apart on the substrate; and
a plurality of unit devices that are each electrically connected to a separate pixel circuit of the plurality of pixel circuits,
wherein each pixel circuit of the plurality of pixel circuits includes a plurality of thin film transistors, the plurality of thin film transistors including a first thin film transistor and a second thin film transistor, the first and second thin film transistors including separate, respective semiconductor layers, and
wherein the first thin film transistor is on the first region of the substrate and the second thin film transistor is on the second region of the substrate.

2. The flexible device of claim 1, wherein
the first thin film transistor comprises a non-stretchable semiconductor layer, and
the second thin film transistor comprises a stretchable semiconductor layer.

3. The flexible device of claim 2, wherein the stretchable semiconductor layer comprises a semiconductor material and an elastomer.

4. The flexible device of claim 3, wherein the semiconductor material comprises an organic semiconductor, an oxide semiconductor, or any combination thereof.

5. The flexible device of claim 2, wherein the stretchable semiconductor layer comprises an organic semiconductor.

6. The flexible device of claim 1, wherein
the first thin film transistor is a driving thin film transistor, and
the second thin film transistor is a switching thin film transistor.

7. The flexible device of claim 1, wherein
the first region of the substrate is a plurality of island-shaped regions spaced apart at a particular interval, and
the second region of the substrate is a stretchable region of the substrate and is a single, continuous structure that extends continuously between the plurality of island-shaped regions.

8. The flexible device of claim 7, further comprising:
a connecting wire on the stretchable region of the substrate, the connecting wire electrically connecting adjacent unit devices of the plurality of unit devices.

9. The flexible device of claim 1, wherein
the first region of the substrate comprises
a plurality of island-shaped regions spaced apart at a particular interval, and
a connection region connecting the plurality of island-shaped regions.

10. The flexible device of claim 9, further comprising:
a connecting wire on the connection region of the substrate, the connecting wire electrically connecting adjacent unit devices of the plurality of unit devices that at least partially overlap separate, respective adjacent island-shaped regions.

11. The flexible device of claim 1, wherein the first elastic modulus is about 10 times to about $10^8$ times higher than the second elastic modulus.

12. The flexible device of claim 1, wherein
the first region of the substrate comprises polycarbonate, polymethylmethacrylate, polyethyleneterephthalate, polyethylenenaphthalate, polyimide, polyamide, polyamideimide, polyethersulfone, or any combination thereof, and
the second region of the substrate comprises a polyorganosiloxane, a polymer comprising a butadiene moiety, a polymer comprising a urethane moiety, a polymer comprising an acrylic moiety, a polymer comprising an olefin moiety, or any combination thereof.

13. The flexible device of claim 1, wherein
the first region of the substrate comprises a first polymer, and
the second region of the substrate comprises a second polymer,
wherein the first polymer and the second polymer comprise at least one same structural unit.

14. The flexible device of claim 13, wherein
the first polymer is a first copolymer that includes a hard structural unit of the first polymer and a soft structural unit of the first polymer,
the second polymer is a second copolymer that includes a hard structural unit of the second polymer and a soft structural unit of the second polymer,
a weight ratio of the hard structural unit of the first polymer to the soft structural unit of the first polymer is about 1.2 to about 9.9, and
a weight ratio of the hard structural unit of the second polymer to the soft structural unit of the second polymer is about 0.01 to about 0.7.

15. The flexible device of claim 1, wherein each unit device of the plurality of unit devices comprises a light emitting diode, photoelectric conversion diode, or any combination thereof.

16. The flexible device of claim 15, wherein each unit device of the plurality of unit devices is on the first region of the substrate.

17. The flexible device of claim 1, wherein
each pixel circuit of the plurality of pixel circuits further comprises a capacitor,
the plurality of thin film transistors comprises a driving thin film transistor and a switching thin film transistor,
the capacitor of each pixel circuit, the driving thin film transistor of each pixel circuit, and the plurality of unit devices are on the first region of the substrate, and
the switching thin film transistor of each pixel circuit is on the second region of the substrate.

18. The flexible device of claim 1, wherein
the flexible device is a display panel or sensor array, and
a quantity of pixels per unit area of the display panel or the sensor array is about 200 ppi to about 1000 ppi.

19. The flexible device of claim 1, wherein the substrate is a stretchable substrate.

20. A flexible device, comprising:
a substrate including a first region having a first elastic modulus and a second region having a second elastic modulus that is lower than the first elastic modulus;
a plurality of pixel circuits spaced apart on the substrate; and a plurality of unit devices on the first region of the substrate, the plurality of unit devices each being electrically connected to a separate pixel circuit of the plurality of pixel circuits, wherein each pixel circuit of the plurality of pixel circuits includes a driving thin film transistor and a switching thin film transistor, and wherein the switching thin film transistor is on the second region of the substrate.

21. The flexible device of claim 20, wherein the plurality of unit devices and the driving thin film transistor are both on the first region of the substrate.

22. The flexible device of claim 20, wherein the switching thin film transistor and the driving thin film transistor comprise a same semiconductor layer or different semiconductor layers, the switching thin film transistor comprises an organic semiconductor layer, a first oxide semiconductor layer, or any combination thereof, and the driving thin film transistor comprises a silicon semiconductor layer, a second oxide semiconductor layer, or any combination thereof.

23. The flexible device of claim 20, wherein the flexible device is a display panel or a sensor array, and a quantity of pixels per unit area of the display panel or the sensor array is about 200 ppi to about 1000 ppi.

24. An electronic device comprising the flexible device of claim 1.

25. An electronic device comprising the flexible device of claim 20.

26. A flexible device, comprising:

a substrate including a first region and a second region, the first region having a first elastic modulus and the second region having a second elastic modulus that is lower than the first elastic modulus;

a pixel circuit on the substrate, the pixel circuit including a plurality of thin film transistors, at least one thin film transistor of the plurality of thin film transistors being on the second region of the substrate; and a unit device on the first region of the substrate, the unit device electrically connected to the pixel circuit.

27. The flexible device of claim 26, wherein the plurality of thin film transistors includes a driving thin film transistor and a switching thin film transistor, the at least one thin film transistor that is on the second region of the substrate includes the switching thin film transistor, and the driving thin film transistor is on the first region of the substrate.

28. The flexible device of claim 27, wherein the switching thin film transistor comprises an organic semiconductor layer, a first oxide semiconductor layer, or any combination thereof, and the driving thin film transistor comprises a silicon semiconductor layer, a second oxide semiconductor layer, or any combination thereof.

29. The flexible device of claim 26, wherein the first region of the substrate is a plurality of island-shaped regions spaced apart at a particular interval, the second region of the substrate is a stretchable region of the substrate and is a single, continuous structure that extends continuously between the plurality of island-shaped regions, the flexible device includes a plurality of pixel circuits, the plurality of pixel circuits including the pixel circuit, each pixel circuit including a separate plurality of thin film transistors that are partially on a separate island-shaped region of the plurality of island-shaped regions, and the flexible device further includes a plurality of unit devices, the plurality of unit devices including the unit device, each unit device electrically connected to a separate pixel circuit of the plurality of pixel circuits.

30. The flexible device of claim 29, further comprising:

a connecting wire on the second region of the substrate, the connecting wire electrically connecting adjacent unit devices of the plurality of unit devices that at least partially overlap separate, respective adjacent island-shaped regions.

31. The flexible device of claim 29, wherein the first region of the substrate includes a connection region connecting the plurality of island-shaped regions, and the flexible device further includes a connecting wire on the connection region, the connecting wire electrically connecting adjacent unit devices of the plurality of unit devices that at least partially overlap separate, respective adjacent island-shaped regions.

32. The flexible device of claim 29, wherein each pixel circuit of the plurality of pixel circuits includes a capacitor, the plurality of thin film transistors of each pixel circuit of the plurality of pixel circuits include a driving thin film transistor and a switching thin film transistor, the capacitor of each pixel circuit and the driving thin film transistor of each pixel circuit are on the first region of the substrate, and the switching thin film transistor of each pixel circuit is on the second region of the substrate.

33. The flexible device of claim 26, wherein the at least one thin film transistor overlaps at least a portion of the second region of the substrate in a direction extending perpendicular to an upper surface of the substrate and does not overlap any portion of the first region in the direction.

34. An electronic device comprising the flexible device of claim 26.

* * * * *